(12) United States Patent
Hsieh et al.

(10) Patent No.: US 6,204,676 B1
(45) Date of Patent: Mar. 20, 2001

(54) TESTING APPARATUS FOR TESTING A BALL GRID ARRAY DEVICE

(75) Inventors: Yi-Chang Hsieh; Lai-Fue Hsieh, both of Hsin-Chu; Mu-Sheng Liao, Chu-Pei, all of (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 0 days.

(21) Appl. No.: 09/307,964

(22) Filed: May 10, 1999

(51) Int. Cl.[7] .................................................. G01R 31/02
(52) U.S. Cl. ........................ 324/755; 324/754; 324/758
(58) Field of Search ...................................... 324/755, 754, 324/761, 758, 765; 439/682, 70, 72

(56) References Cited

U.S. PATENT DOCUMENTS

| | | | | |
|---|---|---|---|---|
| 5,982,186 | * | 11/1999 | Buschbom | 324/755 |
| 6,018,249 | * | 1/2000 | Akram et al. | 324/758 |
| 6,046,597 | * | 4/2000 | Barabi | 324/755 |
| 6,069,481 | * | 5/2000 | Matsumura | 324/755 |
| 6,069,482 | * | 5/2000 | Hilton | 324/755 |
| 6,084,397 | * | 7/2000 | Downes | 324/158.1 |
| 6,084,421 | * | 7/2000 | Swart et al. | 324/755 |
| 6,094,057 | * | 7/2000 | Hiruta et al. | 324/755 |

* cited by examiner

Primary Examiner—Safet Metjahic
Assistant Examiner—T. R. Sundaram
(74) Attorney, Agent, or Firm—Ladas & Parry

(57) ABSTRACT

A testing apparatus for testing a ball grid array (BGA) device, includes a movable carrier which has a top face recessed to form a cavity of square shape to receive the BGA device. A centering member is disposed at a center part of a cavity bottom face of the cavity to center a squarely looped array of voltage source solder balls formed at a bottom face of the BGA device, relative to the center part of the cavity bottom face. The centering member projects upward from the cavity bottom face to engage and prevent positional deviation of the squarely looped array of the voltage source solder balls when the BGA device is seated on the cavity bottom face. The testing apparatus further includes a testing circuit unit, a surface mount matrix disposed on top of the testing circuit unit, and a hollow frame member mounted on top of the surface mount matrix. The frame member has a square central opening to expose the surface mount matrix, and the surface mount matrix can make a direct electrical contact with the BGA device when the latter is placed in the central opening.

3 Claims, 5 Drawing Sheets

US 6,204,676 B1

TESTING APPARATUS FOR TESTING A BALL GRID ARRAY DEVICE

BACKGROUND OF THE INVENTION

1. Field of the Invention

The invention relates to for a ball grid array (BGA) device, more particularly to a testing apparatus adapted for use in testing BGA devices.

2. Description of the Related Art

Ball grid array (BGA) packages are high pin count integrated circuit packages that are widely used in surface mounting applications. Referring to FIG. 1, a known BGA device 1 includes a semiconductor device 12 disposed on a dielectric insulating substrate 11 that is formed with circuit traces (not shown) for electrical connection with the semiconductor device 12. A plurality of signal, ground and voltage source solder balls 13, 14 and 15, that are formed from tin, are provided on a bottom face of the insulating substrate 11 and are connected electrically to the circuit traces to serve as electrical contacts for the BGA device 1. The signal solder balls 13 are arranged in an array at a periphery of the bottom face. The voltage source solder balls 15 are arranged in a squarely looped array at a central portion of the bottom face. The ground solder balls 14 are arranged in rows within the squarely looped array, and are spaced apart from the voltage source solder balls 15. In the mass production of BGA devices 1, a number of insulating substrates 11 are initially interconnected as a large insulating plate. After the circuit traces are formed, the large insulating plate is subsequently cut to form the individual insulating substrates 11, thereby resulting in exposed conductive contacts (not shown) on the margins 16 of each insulating substrate 11.

Referring to FIGS. 2 and 3, a conventional testing apparatus for testing BGA devices includes a movable carrier 3 for receiving a BGA device 1, a tester 2, and a moving device (not shown) for moving the BGA device 1 from the carrier 3 to the tester 2. The carrier 3 has a squarely looped flange 31 formed on a bottom side of an inner surface of the carrier 3 for isolating the BGA device 1 from the bottom side. The squarely looped flange 31 has a cross-section larger than that of the squarely looped array of the voltage source solder balls 15. The tester 2 includes a testing circuit unit 21 provided with a testing circuit layout, and a socket 23 formed from an insulator material and retained on the testing circuit unit 21 via a mounting seat 22 that is fixed on the testing circuit unit 21. The socket 23 is formed with a receiving space 25 that opens upwardly. Guide members 26 project inwardly from the socket 23 into the receiving space 25. The socket 23 has a contactor plate 27 disposed at a bottom end of the receiving space 25 and formed with a plurality of spring probes or pogo pins 29 that are registered with the solder balls 13, 14 and 15 of the BGA device 1 that is to be tested. A surface mount matrix 24 interconnects the pogo pins 29 and the testing circuit layout on the testing circuit unit 21. The pogo pins 29, in turn, interconnect the BGA device 1 and the surface mount matrix 24.

When testing the BGA device 1 for defects, the BGA device 1 is loaded into the receiving space 25 of the socket 23 to enable the solder balls 13, 14 and 15 to contact the pogo pins 29. The guide members 26 function to align the BGA device 1 in relation to the pogo pins 29 in the receiving space 25 by contacting the margins 16 of the insulating substrate 11 so as to guide the insulating substrate 11 into the receiving space 25 in a proper position. The BGA device 1 is then pressed toward the pogo pins 29 to ensure electrical connection between the BGA device 1 and the testing circuit layout 28 on the testing circuit unit 21 via the pogo pins 29 and the surface mount matrix 5.

Some of the drawbacks of the conventional testing apparatus described beforehand are as follows:

1. As the distances of the margins 16 of the insulating substrate 11 from the solder balls 13, 14 and 15 can vary due to errors that may occur during the cutting of the insulating substrate 11, there are chances that the solder balls 13, 14 and 15 will not be placed properly on the pogo pins 29 when aligning the BGA device 1 in relation to the pogo pins 29 by referring to the margins 16 of the insulating substrate 11. When the BGA device 1 is pressed toward the pogo pins 29, scratching of the surface of the solder balls 13, 14 and 15 by the pogo pins 29 is likely occur. The solder material removed from one of the solder balls 13, 14 and 15 can get trapped between an adjacent pair of the solder balls 13, 14 and 15 and can result in short-circuiting. Moreover, the solder balls, once scratched, will decrease of the yield of non-defective products during the surface mounting of the BGA device 1.

2. As mentioned beforehand, exposed conductive contacts are present on the margins 16 of the insulating substrate 11 of the BGA device 1. After the BGA device 1 has been tested for defects and is removed from the socket 23, static electricity is usually observed between the guide members 26 in the receiving space 25 and exposed conductive contacts at the margins 16 of the BGA device 1. The static electricity is discharged via the BGA device 1 since the socket 23 is made entirely from an insulator material, and can result in damage to the BGA device 1.

3. Due to the lengths of the pogo pins 29, the BGA device 1 experiences loss during high frequency testing.

SUMMARY OF THE INVENTION

Therefore, the main object of the present invention is to provide a testing apparatus for a BGA device that can avoid scratching of the solder balls, that can reduce the amount of static electricity discharge during testing the BGA device for defects, and that can minimize losses during high frequency testing.

According to this invention, a testing apparatus is adapted for testing a ball grid array (BGA) device having a bottom face formed with a plurality of signal solder balls, a plurality of ground solder balls, and a plurality of voltage source solder balls. The voltage source solder balls are arranged in a squarely looped array at a central portion of the bottom face of the BGA device. The ground solder balls are arranged in rows within the squarely looped array and are spaced apart from the voltage source solder balls.

The testing apparatus includes a movable carrier, a tester and a moving device. The carrier has a top face recessed to form a cavity of square shape which is adapted to receive the BGA device and which has a cavity bottom face, and a centering member disposed at a center part of the cavity bottom face and adapted to center the squarely looped array of the voltage source solder balls relative to the center part of the cavity bottom face. The centering member includes ridge means projecting upward from the cavity bottom face and adapted to engage and prevent positional deviation of the squarely looped array of the source solder balls when the BGA device is seated on the cavity bottom face. The tester includes a testing circuit unit provided with a testing circuit layout, a surface mount matrix disposed on top of the testing circuit unit, and a hollow frame member mounted on top of the surface mount matrix. The frame member has an inner wall face confining a square central opening to expose the surface mount matrix so as to permit the surface mount matrix to make a direct electrical contact with the BGA device when the BGA device is placed in the central opening. The inner wall face is free of means for aligning and guiding margins of the BGA device relative to the surface mount matrix. The moving device is movable from the carrier to the frame member and is adapted to remove the BGA device from the carrier and to locate the BGA device in the central opening of the frame member.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
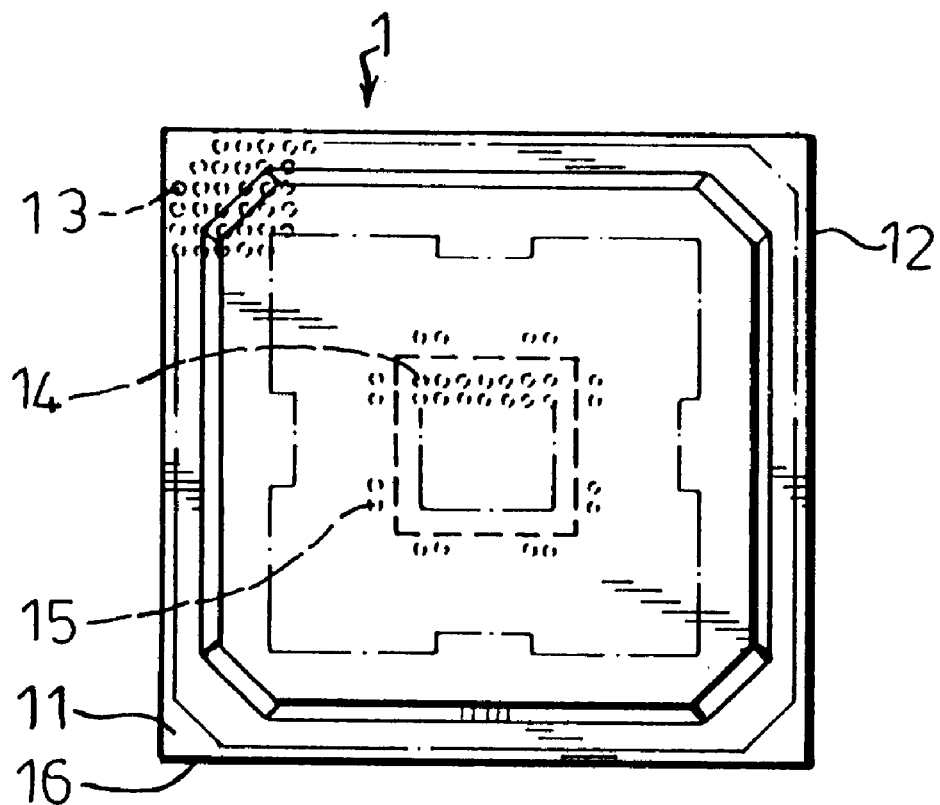
FIG. 1 is a schematic top view of a conventional BGA device.
Figure 2:
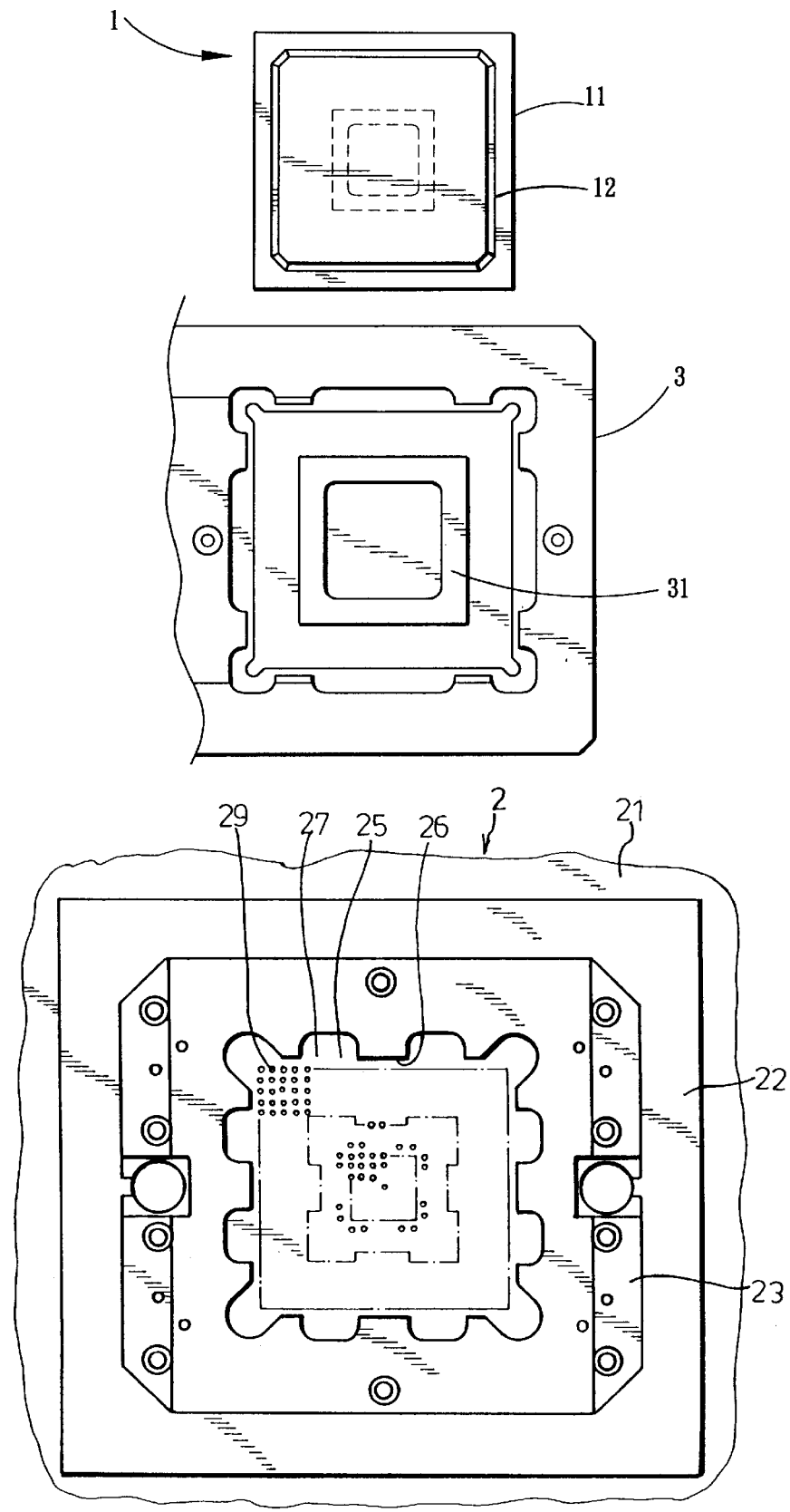
FIG. 2 is a schematic top view of conventional carrier and tester for a BGA device.
Figure 3:
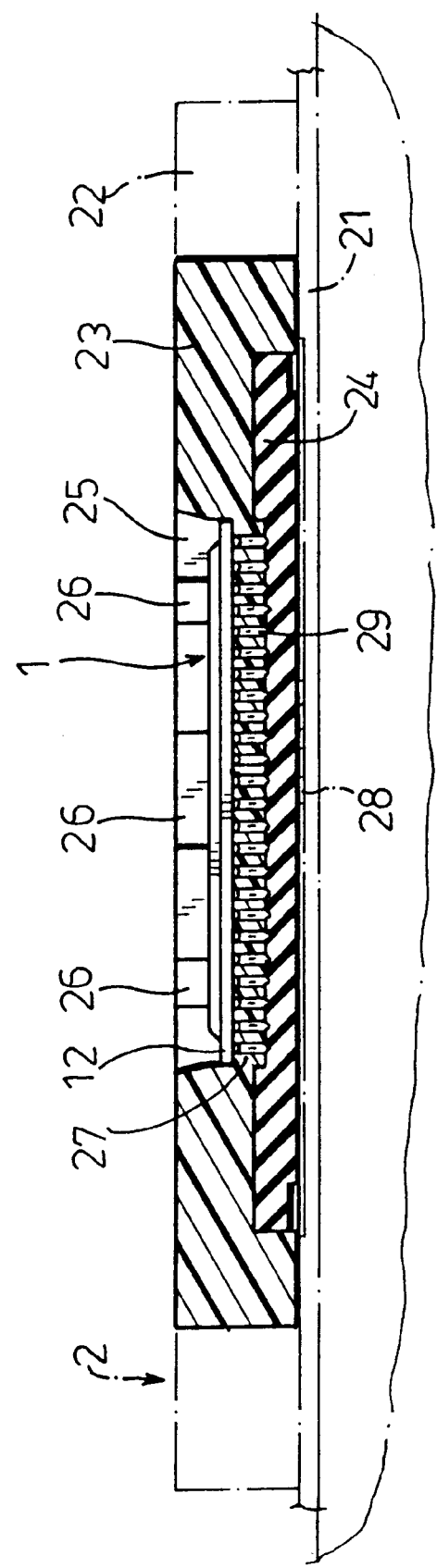
FIG. 3 is a schematic sectional view of the conventional tester.
Figure 4:
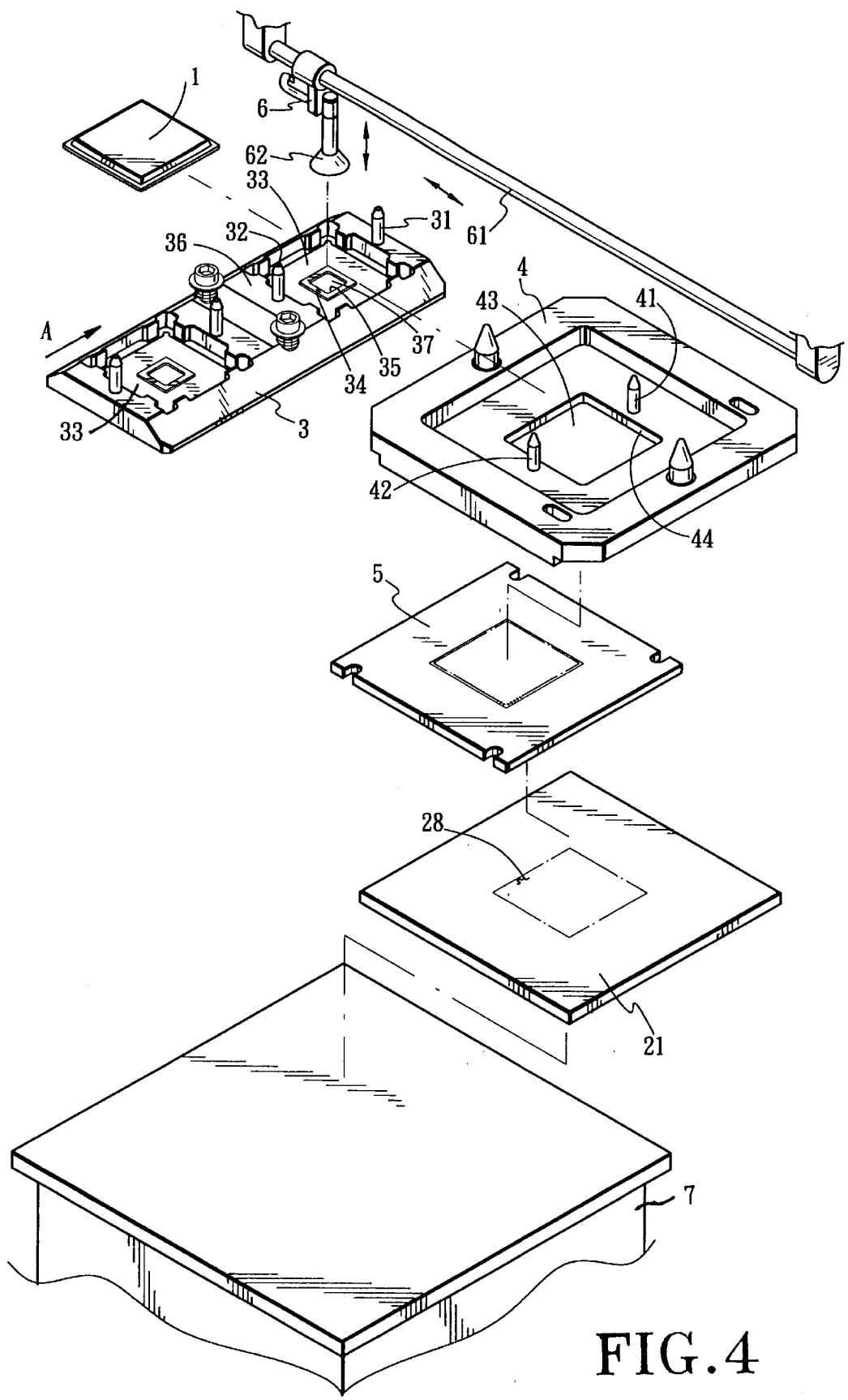
FIG. 4 is a schematic top view of the preferred embodiment of a testing apparatus for a BGA device according to the present invention.
Figure 5:
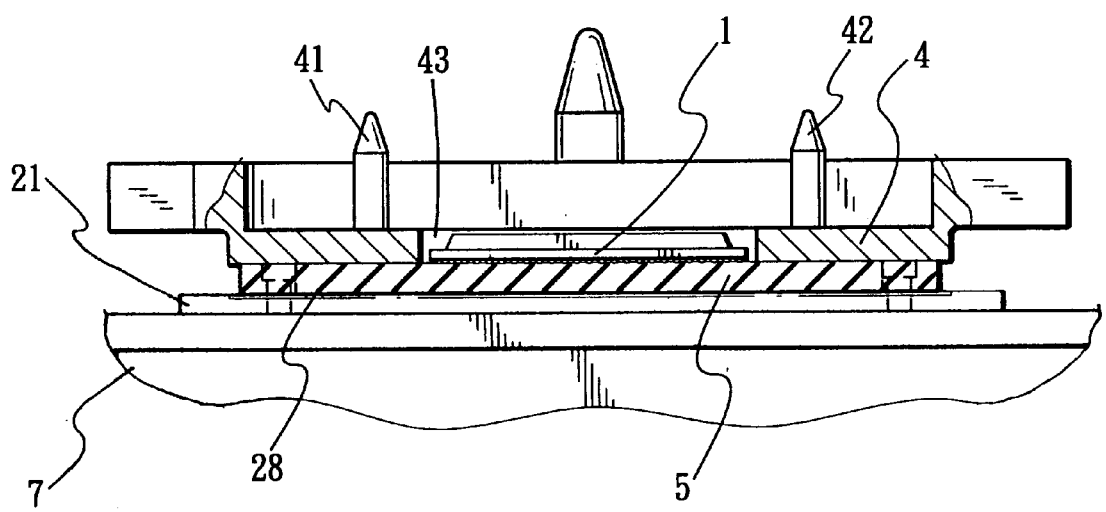
FIG. 5 is a schematic sectional view of the preferred embodiment of a tester of the preferred embodiment.

Referring to FIGS. 4 and 5, the preferred embodiment of a testing apparatus according to this invention is shown together with the conventional BGA device 1 illustrated in FIG. 1. The testing apparatus comprises a movable carrier 3, a tester and a moving device 6.

The carrier 3 has a top face 36 recessed to form a cavities 33 of square shape which are adapted to respectively receive two BGA device 1. The carrier 3 is movable in a direction shown by arrow A in FIG. 4 to align each of the cavities 33 successively with a frame member 4 of the tester. Each cavity has a cavity bottom face 37, and a squarely looped ridge 34 disposed at a center part of the cavity bottom face 37 and adapted to center the squarely looped array of the voltage source solder balls 15 of the BGA device 1 relative to the center part of the cavity bottom face 37. The squarely looped ridge 34 projects upward from the cavity bottom face 37. The outer surface of the squarely looped ridge 34 defines a square with a cross-section slightly smaller than that the square defined by of the squarely looped array of the voltage source solder balls 15 so that the squarely looped ridge 34 is sleeved by the squarely looped array of the voltage source solder balls 15, when the BGA device 1 is seated on the squarely looped ridge 34. Therefore, the outer surface of the squarely looped ridge 34 engages the voltage source solder balls 15 and prevents any positional deviation of the squarely looped ridge 34 relative to the center part of the cavity bottom face 37. The cross section of the square defined by the inner surface 35 of the squarely looped ridge 34 is slightly greater than that of the defined by the ground solder balls 14 of the BGA device 1 so that the inner surace 35 of the squarely looped ridge 34 encompasses the ground solder balls 14 when the BGA device 1 is seated on the squarely looped ridge 34.

The tester includes a testing circuit unit 21 provided with a testing circuit layout 28, a surface mount matrix 5 disposed on top of the testing circuit unit 21, and a hollow frame member 4 mounted on top of the surface mount matrix 5. The frame member 4 has an inner wall face 44 confining a square central opening 43 to expose the surface mount matrix 5 so as to permit the surface mount matrix 5 to make a direct electrical contact with the BGA device 1 when the BGA device 1 is placed in the central opening 43. Via the surface mount matrix 5, the solder balls 13, 14 and 15 of the BGA device 1 are connected electrically to the testing circuit layout 28 disposed beneath the surface mount matrix 5.

There are a pair of opposite stubs 31, 32 disposed on the top face 36 of the carrier 3 and aligned in the direction of movement of the carrier 3, and a pair of opposite stubs 41, 42 disposed on two sides of the inner wall face 44 of the frame member 4. The opposite stubs 41, 42 are registered with the opposite stubs 31, 32, respectively, for aligning the carrier 3 relative to the frame member 4 in a known manner.

The moving device 6, which is conventional in structure, includes an arm unit 61 extending above the carrier 3 and the frame member 4, and a suction unit 62 disposed movably on the arm unit 61. The suction unit 62 is movable from the carrier 3 and the frame member 4, and is adapted to remove the BGA device 1 from the carrier 3 and to locate the BGA device 1 in the central opening 43 of the frame member 4.

The moving device 6 is movable between the carrier 3 and the frame member 4 and is used to transfer the BGA device 1 placed in the carrier 3, that is aligned properly with the frame member 4 via the aligning stubs 31, 32, 41, 42, to the central opening 43 of the frame member 4. In the present invention, the squarely looped ridge 34 in the square cavity 33 of the carrier 3 functions to center and align the BGA device 1 in relation to the center part of the cavity 33 and the carrier 3. The carrier 3 is, in turn, aligned with the frame member 4 via the aligning stubs 31, 32, 41, 42. The suction unit 62 of the moving device 6 moves along the arm unit 61, and picks up the BGA device 1 from the carrier 3 and transfers the same to the central opening 43 of the frame member 4 in a known manner.

As shown in FIG. 5, when the BGA device 1 is seated on the surface mount matrix 5, the solder balls 13, 14, 15 of the BGA device 1 are electrically connected to the testing circuit layout 28 of the testing circuit unit 21 via the surface mount matrix 5.

As described above, the present invention does not employ the dielectric insulating socket 23 which is used in the conventional testing apparatus to position the BGA device 1 in the testing unit through guiding of the margins of the BGA device 1 as described hereinbefore. The squarely looped ridge 34 is used to center the squarely looped array of the voltage source solder balls 15 in relation to the carrier 3 so that, after the BGA device 1 is transferred to the central opening 43 of the frame member 4, the BGA device 1 is positioned properly in relation to the surface mount matrix 5 and the testing circuit unit 21.

Some of the advantages of the testing apparatus of this invention are as follows:

1. Because this invention is free of the socket 23 used in the prior art, the production cost is reduced. In addition, the static electricity discharge (ESD) issue encountered in the prior art is eliminated.

2. Because the pogo pins 29 used in the conventional testing apparatus are not needed in the present invention, the problems associated with the pogo pins 29 are avoided in the present invention.

3. Because the BGA device 1 is in direct contact with the surface mount matrix 5, no loss is experienced during high frequency testing.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A testing apparatus for testing a ball grid array (BGA) device, the device having a bottom face formed with a plurality of signal solder balls, a plurality of ground solder balls, and a plurality of voltage source solder balls, the voltage source solder balls being arranged in a squarely looped array at a central portion of the bottom face of the BGA device, the ground solder balls being arranged in rows within the squarely looped array and being spaced apart from the voltage source solder balls, said testing apparatus comprising:

a movable carrier having a top face recessed to form a cavity of square shape which is adapted to receive the BGA device and which has a cavity bottom face, and a centering member disposed at a center part of said cavity bottom face and adapted to center the squarely looped array of the voltage source solder balls relative to said center part of said cavity bottom face, said centering member including ridge means projecting upward from said cavity bottom face and adapted to engage and prevent positional deviation of the squarely looped array of the voltage source solder balls when the BGA device is seated on said cavity bottom face;

a tester including a testing circuit unit provided with a testing circuit layout, a surface mount matrix disposed on top of said testing circuit unit, and a hollow frame member mounted on top of said surface mount matrix, said frame member having an inner wall face confining a square central opening to expose said surface mount matrix so as to permit said surface mount matrix to make a direct electrical contact with the BGA device when the BGA device is placed in said central opening, said inner wall face being free of means for aligning and guiding and contacting margins of the BGA device relative to said surface mount matrix; and a moving device movable from said carrier to said frame member and adapted to remove the BGA device from said carrier and to locate the BGA device in said central opening of said frame member.

2. The testing apparatus as claimed in claim 1, wherein said ridge means includes a squarely looped ridge, the outer surface of the squarely looped ridge defining a square with a cross section smaller than that of the square defined by the squarely looped array of said voltage source solder balls so that said squarely looped ridge is adapted to engage the squarely looped array of the voltage source solder balls when the BGA device is seated on said squarely looped ridge, said squarely looped ridge having an inner surface which defines a square with a cross section greater than that of the square defined by the ground solder balls so that the squarely looped ridge encompasses the ground solder balls when the BGA device is seated on said squarely looped ridge.

3. The testing apparatus as claimed in claim 1, wherein said moving device includes an arm unit extending above said carrier and said frame member, and a suction unit disposed movably on said arm unit.

* * * * *